(12) United States Patent
Tsai et al.

(10) Patent No.: US 6,191,042 B1
(45) Date of Patent: Feb. 20, 2001

(54) METHOD OF FORMING NODE CONTACT OPENING

(75) Inventors: Chien-Hua Tsai, Taichung; Kuo-Chi Lin, Lu-Chou, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/246,761

(22) Filed: Feb. 8, 1999

(30) Foreign Application Priority Data

Dec. 15, 1998 (TW) .................................................. 87120802

(51) Int. Cl.[7] .................................................. H01L 21/311
(52) U.S. Cl. .................. 438/700; 438/704; 438/706; 438/710
(58) Field of Search .................... 438/700, 696, 438/704, 706, 710

(56) References Cited

U.S. PATENT DOCUMENTS

| | | | |
|---|---|---|---|
| 5,369,048 | * | 11/1994 | Hsue ........................................ 437/52 |
| 5,547,893 | * | 8/1996 | Sung ........................................ 437/52 |
| 5,652,165 | * | 7/1997 | Lu et al. .................................. 437/52 |
| 5,710,460 | * | 1/1998 | Leidy et al. ............................ 257/752 |
| 5,728,618 | * | 3/1998 | Tseng ..................................... 438/253 |
| 5,763,286 | * | 6/1998 | Figura et al. ............................ 437/60 |
| 5,843,820 | * | 12/1998 | Lu ........................................... 438/243 |
| 5,915,177 | * | 6/1999 | Tseng ..................................... 438/264 |

* cited by examiner

*Primary Examiner*—Benjamin L. Utech
*Assistant Examiner*—Vanessa Perez-Ramos
(74) *Attorney, Agent, or Firm*—Jiawei Huang; J C Patents

(57) ABSTRACT

A method of fabricating a node contact opening includes formation of a dielectric layer on a substrate. An opening is formed with $C_4F_8/Ar/CH_2F_2$ as an etchant. A portion of the dielectric layer under the opening is etched with $CHF_3/CO$ as an etchant until the substrate is exposed. A node contact opening is formed.

13 Claims, 3 Drawing Sheets

US 6,191,042 B1

METHOD OF FORMING NODE CONTACT OPENING

CROSS-REFERENCE TO RELATED APPLICATION

This application claims the priority benefit of Taiwan application serial no. 87120802, filed Dec. 15, 1998.

BACKGROUND OF THE INVENTION

1. Field of the Invention

The present invention relates to a semiconductor fabricating method. More particularly, the present invention relates to a method of fabricating a node contact in a dynamic random access memory (DRAM).

2. Description of the Related Art

As the number of semiconductor devices incorporated in integrated circuits increases, the size of the devices needs to be decreased according to a design rule. In a photolithographic step it is necessary to avoid misalignment. That is, a node contact must be aligned with a source/drain region in a substrate. As the size of a node contact increases, alignment accuracy decreases. Thus, in practice, a node contact easily makes contact with the neighboring bit lines, which causes a short in the devices.

The conventional methods to decrease the size of a node contact include a photoresist reflow method and a polysilicon spacer method.

FIGS. 1A to 1C are schematic. cross-sectional views showing a photoresist reflow method for forming a node contact opening.

In FIG. 1A, a substrate 100 having a dielectric layer 102. a bit line 106, and a dielectric layer 104 formed thereon is provided. A photoresist layer 108 is formed on the dielectric layer 104 to expose a portion of the dielectric layer 104.

In FIG. 1B, a thermal reflow step is performed. The increasing temperature leads to the increasing fluidity of the photoresist layer 108. A photoresist layer 108a with an opening 110a thus is formed. The opening 110a is smaller than the opening 110.

In FIG. 1C, the plhotoresist layer 108a is used as a mask. An etching step is performed. A node contact opening 112 is formed in the dielectric layers 102 and 104 to expose the substrate 100.

However, performing the photoresist reflow method requires specific machinery, so the method cannot be easily performed.

FIGS. 2A to 2B are schematic, cross-sectional views showing a polysilicon spacer method for forming a node contact opening.

In FIG. 2A, a substrate 200 having a dielectric layer 202, a dielectric layer 204, and a bit line 206 formed thereon is provided. A polysilicon layer 210 having an opening 224 is formed on the dielectric layer 204. The opening 224 in the dielectric layer 204 exposes a portion of the dielectric layer 204. A polysilicon layer 212, which is conformal to the opening, 224, is formed on the polysilicon layer 210.

FIG. 2B, an etching step is performed. A portion of the polysilicon layer 212 is removed to form a spacer 212a on a sidewall of the opening 224. The polysilicon layer 210 and the spacer 212a are used as masks. An etching step is performed to form a node contact opening 220 in the dielectric layer 204 and 202 until the substrate 200 is exposed.

In the above procedures for forming a node contact opening 220, the size of the contact node opening 220 can be further decreased with the spacer 212a used as a mask. However, the method needs multiple, or more than two, polysilicon layers, such as polysilicon layers 210 and 212 and redundant, also more than two, etching steps, which increase the fabrication costs.

SUMMARY OF THE INVENTION

To achieve these and other advantages and in accordance with the purpose of the invention, as embodied and broadly described herein, the invention provides a method of forming a node contact opening. A dielectric layer is formed on a substrate. An opening is formed with $C_4F_8/Ar/CH_2F_2$ used as an etchant. A portion of the dielectric layer under the opening is etched with $CHF_3/CO$ used as an etchant until the substrate is exposed. A node contact opening is formed.

The invention provides a simplified and less expensive method of fabricating a node contact opening.

It is to be understood that both the foregoing general description and the following detailed description are exemplary, and are intended to provide further explanation of the invention as claimed.

BRIEF DESCRIPTION OF THE DRAWINGS

The accompanying, drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
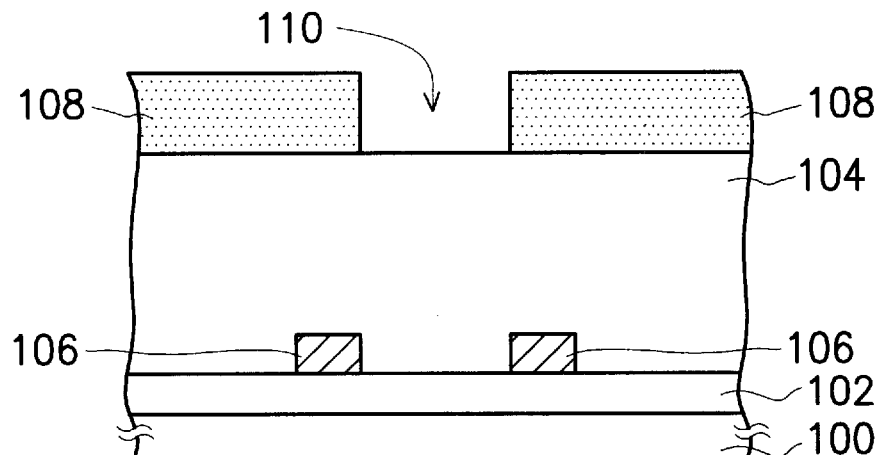
FIGS. 1A to 1C are schematic, cross-sectional views showing a photoresist reflow method for forming a node contact opening.
Figure 1B:
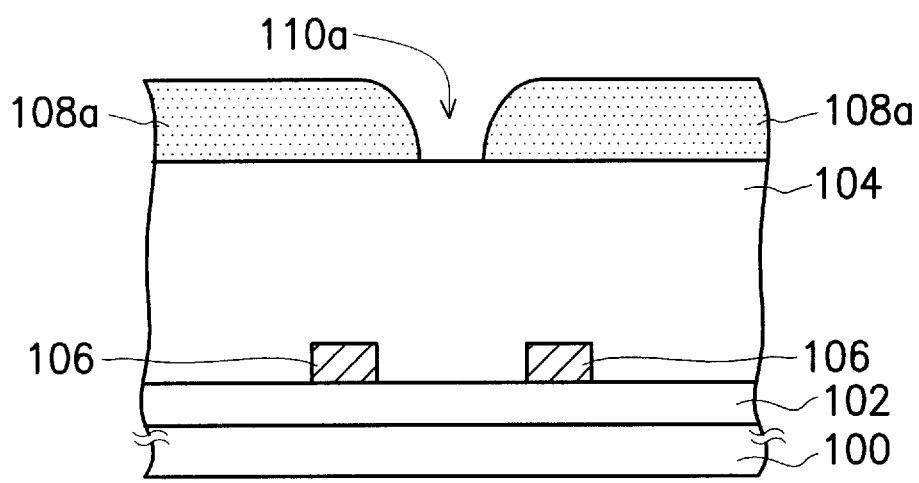
Figure 1C:
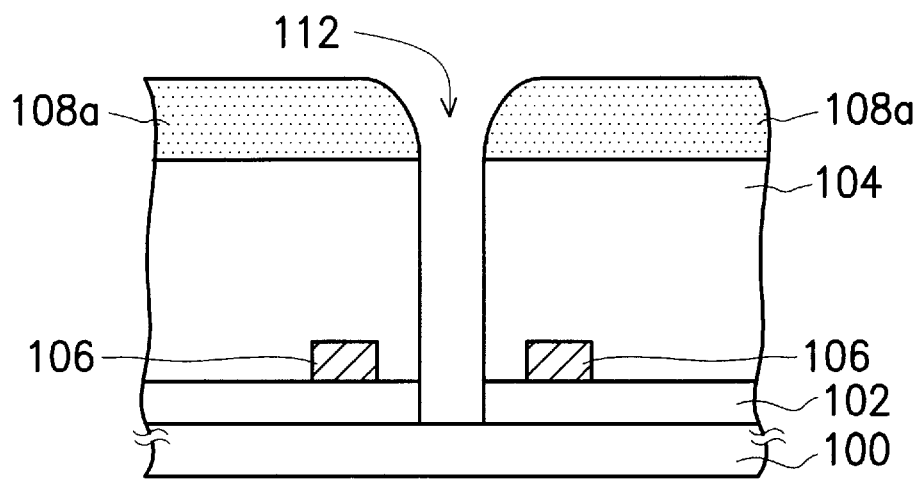
Figure 2A:
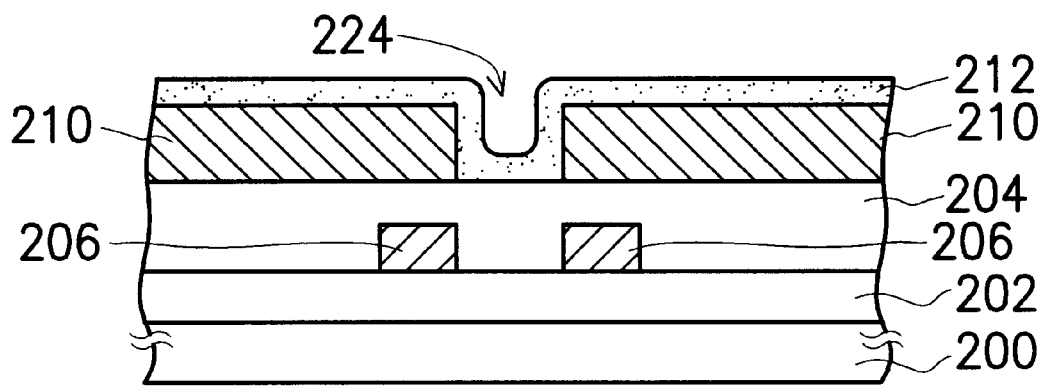
FIGS. 2A to 2B are schematic, cross-sectional views showing a polysilicon spacer method for forming a node contact opening.
Figure 2B:
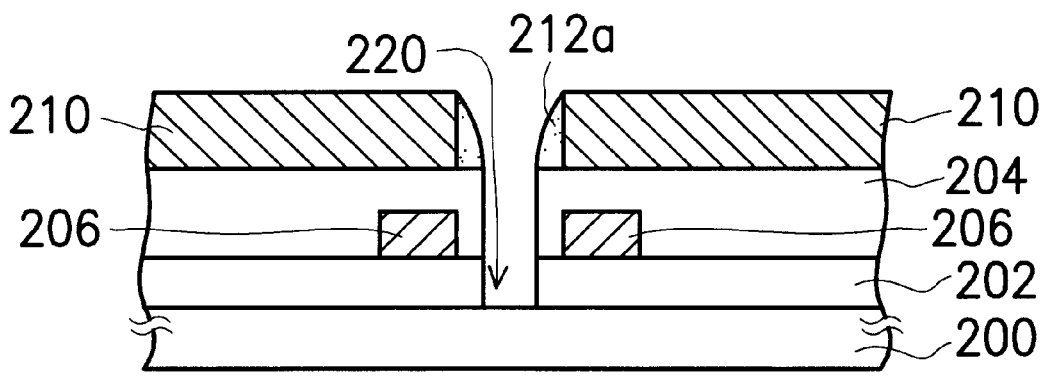

Reference will now be made in detail to the present preferred embodiments of the invention, examples of which are illustrated in the accompanying drawings. Wherever possible, the same reference numbers are used in the drawings and the description to refer to the same or like parts.

Figure 3A:
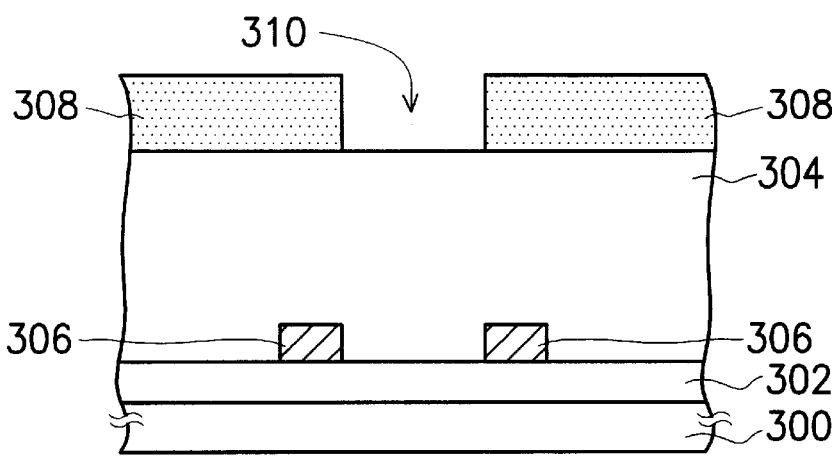
FIGS. 3A through 3C are schematic, cross-sectional views showing a fabricating method of node contact opening according to one preferred embodiment of the invention.

In FIG. 3A, a dielectric layer 302, a dielectric layer 304, and a bit line 306 are formed on a substrate 300. The material of the dielectric layers 302 and 304 includes, for example, silicon oxide or borophosphosilicate glass (BPSG). The dielectric layer 302 and 304 can be, for example, formed by chemical vapor deposition and with the same or different materials. A photoresist layer 308 having an opening 310 is formed on the dielectric layer 304.

Figure 3B:
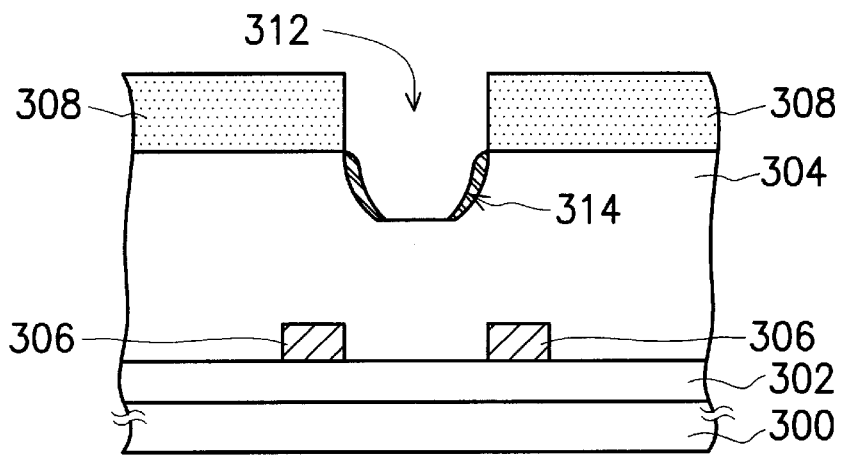

In FIG. 3B, the plhotoresist layer 308 is used as a mask. An etching step is performed with $C_4F_8/Ar/CH_2F_2$ as an etchant. Other suitable etchants may be used. The dielectric layer 304 is etched to form an opening 312. The opening 312 is formed is by adjusting the proportion of the etchant components. Specifically, the size and dimension of the opening 312 can be adjusted by controlling the proportion of the etchant components and/or other etching conditions. The size of the opening dominates the size of a node contact opening (shown in FIG. 3C). In the invention, the depth of the opening 312 depends on the etchant composition, and is independent of the etching time. The $C_4F_8/Ar/CH_2F_2$ etchant is taken as an example in the preferred embodiment, in which the reaction between $C_4F_8$ and $CH_2F_2$ leads to polymer formation. The polymer deposited on the dielectric layer 304 forms a polymer layer 314 during etching. The polymer layer 314 protects the dielectric layer 304 from being removed by etching. The etching area of the dielectric layer 304 decreases because of the coverage by the polymers. The amount of the deposited polymer controls the opening 312 size. The opening 312 is substantially a concave shape. Once the polymers completely cover the surface of the opening 312, the etching step is stopped, which completes the opening 312. The depth of the opening 312 is independent of the etching time. The polymer layer 314 on the sidewall of the opening 312 is thicker than the polymer layer 314 on the bottom of the opening 312. In this preferred embodiment, the $C_4F_8/Ar/CH_2F_2$ etchant is taken as an example, but any other suitable etchant, which forms polymers when etching, can be used in the invention.

Figure 3C:
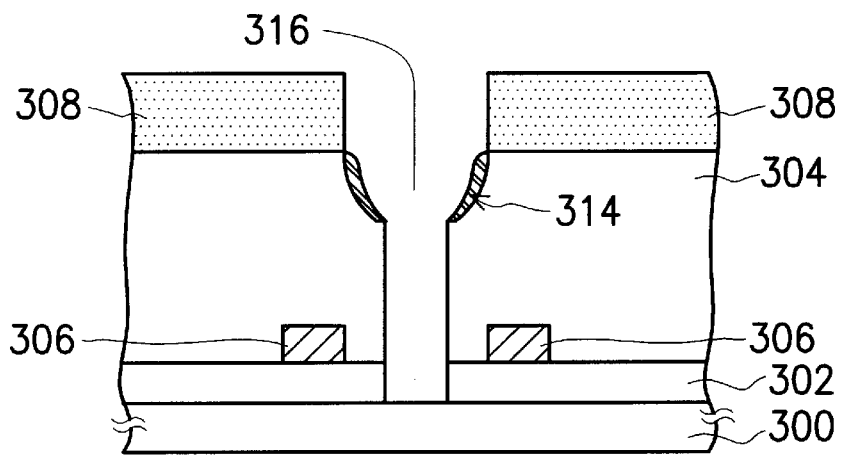

In FIG. 3C, an etching step is performed by using the photoresist layer 308 and the polymer layer 314 as a mask. The etching step includes dry etching. To the advantage of the following fabrication process, the etchant preferably is $CHF_3/CO$, although other suitable etchant which provides a high etching selectivity between the polymer layer 314 and the dielectric layer 302 and 304 may be used. The polymer layer 314 on the bottom of the opening 312 is thinner than the polymer layer 314 on the side of the opening 312, and in addition, the etchant provides high selectivity between the polymer layer 314 and the dielectric layer 302 and 304. Thus, once the thin polymer layer 314 on the bottom of the polymer layer 314 is removed, the dielectric layers 302 and 304 exposed by the remained polymer layer 314 can be further removed. A node contact opening 316 is formed in the dielectric layers 302 and 304. Because the polymer layer 314 on the side of the opening 312 is thicker than it is on the bottom of the opening 312, the polymer layer 314 is not completely removed. The remaining polymer layer 314 protects the dielectric layer 304 from being etched. The dielectric layer 304 exposed by the remaining polymer layer 314 is removed to expose the dielectric layer 302. The dielectric layer 302 exposed by the polymer layer 314 is also removed until the substrate 300 is exposed. A node contact opening 316, which is smaller than the opening 312, is formed.

A capacitor (not shown) is formed in the node contact opening 316. The node contact opening 316 comprises a bottom electrode (not shown), a dielectric layer (not shown), and a top electrode (not shown). The bottom electrode is electrically coupled with a source/drain region (not shown) in the substrate 300 through the node contact opening 316. A dynamic random access memory is formed. The dielectric layer can be, for example, a silicon oxide layer, a silicon nitride/silicon oxide (NO) layer, a silicon oxide/silicon nitride/silicon oxide (ONO) layer, a $Ta_2O_5$ layer, a $Pb(Zr, Ti)O_3$ layer (PZT layer), a $(Ba, Sr)TiO_3$ layer (BST layer), or other layer with a high dielectric constant. The top electrode layer can be, for example, a polysilicon layer formed by chemical vapor deposition. In addition, the polysilicon layer is doped at the same time.

In summary, the invention has at least the following advantages:

1. In the invention, there is no other specific machinery being used.

2. The present invention provides a simplified fabricating process without redundant etching, process and without formation of multiple polysilicon layers.

3. The invention is based on polymers formed after the collision between the etchant components which simplifies the fabrication process and reduces the fabrication costs.

4. In the invention, an opening is formed by adjusting the proportion of the etchant components. Specifically, the size of the opening can be formed by controlling the proportion of the etchant components.

5. The depth of the opening depends on the proportions of the etchant components and is independent of the etching time.

6. The invention is compatible and readily adopted for incorporation into existing systems.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of forming a node contact opening, which is suitable for a substrate having a dielectric layer formed thereon, comprising the steps of:

performing a first etching step on the dielectric layer to form an opening, wherein a polymer layer is formed on a sidewall of the opening during the first etching step, and wherein the first etching step comprises using an etchant comprising $C_4F_8$, Ar and $CH_2F_2$ so as to form the polymer layer during the first etching step; and performing a second etching step with the polymer layer on the sidewall of the opening used as a mask, wherein the dielectric layer exposed by the polymer layer is etched until the substrate is exposed so as to form a node contact opening.

2. The method of claim 1, wherein the etchant forms the polymer layer in the first etching step.

3. The method of claim 1, wherein etching rates of the polymer layer and the dielectric layer are different in the second etching step.

4. The method of claim 1, wherein the second etching step comprises dry etching.

5. The method of claim 1, wherein the second etching step comprises using an etchant that provides a high selectivity between the polymer layer and the dielectric layer.

6. The method of claim 5, wherein the etchant of the second etching step comprises $CHF_3$ and CO.

7. A method of forming a node contact opening, which is suitable for, comprising the steps of:

providing a substrate having a dielectric layer formed thereon;

performing a first etching step on the dielectric layer to form an opening, wherein a polymer layer is formed on a sidewall of the opening during the first etching step, and the thickness of the polymer formed on the sidewall of the opening is thicker than thickness of the polymer formed on the bottom of the opening, and wherein the first etching step comprises using an etchant comprising $C_4F_8$, Ar and $CH_2F_2$ so as to form the polymer layer during the first etching step; and performing a second etching step with the polymer layer on the sidewall of the opening used as a mask, wherein the dielectric layer exposed by the polymer layer is etched until the substrate is exposed so as to form a node contact opening.

8. The method of claim 7, wherein the etchant of the second etching step comprises $CHF_3$ and CO.

9. A method of forming a capacitor of a DRAM, comprising the steps of:

provided a substrate having a dielectric layer formed thereon;

performing a first etching step on the dielectric layer to form an opening, wherein a polymer layer is formed on a sidewall of the opening during the first etching step, and wherein the first etching step comprises using an etchant comprising $C_4F_8$, Ar and $CH_2F_2$ so as to form the polymer layer during the first etching step;

performing a second etching step using the polymer layer on the sidewall of the opening as a mask, wherein the dielectric layer exposed by the polymer layer is etched until the substrate is exposed so as to form a node contact opening;

forming a first conductive layer over the substrate and filled within the node contact opening, wherein the first conductive layer serves as a bottom electrode of the capacitor forming a dielectric film over the first conductive layer; and forming a second conductive layer over the dielectric film, wherein the second conductive layer serves as a top electrode of the capacitor.

10. The method of claim 9, wherein the etchant of the second etching step comprises $CHF_3$ and CO.

11. A method of forming a node contact opening, which is suitable for a substrate having a dielectric layer formed thereon, comprising the steps of:

performing a first etching step on the dielectric layer to form an opening, wherein a polymer layer is formed on a sidewall of the opening during the first etching step; and performing a second etching step with the polymer layer on the sidewall of the opening used as a mask, wherein the dielectric layer exposed by the polymer layer is etched until the substrate is exposed so as to form a node contact opening, wherein the second etching step comprises using an etchant comprising $CHF_3$ and CO that provides a high selectivity between the polymer layer and the dielectric layer.

12. A method of forming a node contact opening, which is suitable for, comprising the steps of:

providing a substrate having a dielectric layer formed thereon;

performing a first etching step on the dielectric layer to form an opening, wherein a polymer layer is formed on a sidewall of the opening during the first etching step, and the thickness of the polymer formed on the sidewall of the opening is thicker than thickness of the polymer formed on the bottom of the opening; and performing a second etching step with the polymer layer on the sidewall of the opening used as a mask, wherein the dielectric layer exposed by the polymer layer is etched until the substrate is exposed so as to form a node contact opening, and wherein the second etching step comprises using an etchant comprising $CHF_3$ and CO.

13. A method of forming a capacitor of a DRAM, comprising the steps of:

providing a substrate having a dielectric layer formed thereon;

performing a first etching step on the dielectric layer to form an opening, wherein a polymer layer is formed on a sidewall of the opening during the first etching step;

performing a second etching step using the polymer layer on the sidewall of the opening as a mask, wherein the dielectric layer exposed by the polymer layer is etched until the substrate is exposed so as to form a node contact opening, and wherein the second etching step comprises using an etchant comprising $CHF_3$ and CO that provides a high selectivity between the polymer layer and the dielectric layer;

forming a first conductive layer over the substrate and filled within the node contact opening, wherein the first conductive layer serves as a bottom electrode of the capacitor;

forming a dielectric film over the first conductive layer; and forming a second conductive layer over the dielectric film, wherein the second conductive layer serves as a top electrode of the capacitor.

\* \* \* \* \*